(12) United States Patent
Sato et al.

(10) Patent No.: US 7,835,042 B2
(45) Date of Patent: Nov. 16, 2010

(54) ELECTRONIC RUBBED COPY IMAGING SYSTEM

(75) Inventors: Tsuneo Sato, Saitama (JP); Hitoshi Miyano, Saitama (JP)

(73) Assignee: Fujifilm Corporation, Tokyo (JP)

( * ) Notice: Subject to any disclaimer, the term of this patent is extended or adjusted under 35 U.S.C. 154(b) by 1056 days.

(21) Appl. No.: 11/528,429

(22) Filed: Sep. 28, 2006

(65) Prior Publication Data

US 2007/0077105 A1    Apr. 5, 2007

(30) Foreign Application Priority Data

Sep. 30, 2005    (JP)    ............................ P2005-288454

(51) Int. Cl.
*H04N 1/46* (2006.01)
(52) U.S. Cl. ........................ 358/501; 358/474; 358/488; 358/493
(58) Field of Classification Search .................. 358/296, 358/300, 473, 474, 475, 482, 483, 484, 488, 358/493
See application file for complete search history.

(56) References Cited

U.S. PATENT DOCUMENTS

| 4,706,130 | A | * | 11/1987 | Yamakawa | .................. | 358/296 |
|---|---|---|---|---|---|---|
| 6,122,481 | A | * | 9/2000 | Rusnack | ...................... | 358/474 |
| 6,661,542 | B1 | * | 12/2003 | Mangerson | .................. | 358/471 |
| 7,268,345 | B2 | * | 9/2007 | Schultz | ........................ | 358/474 |
| 7,362,478 | B2 | * | 4/2008 | Mangerson | .................. | 358/474 |
| 7,405,849 | B2 | * | 7/2008 | Chen | .......................... | 358/493 |
| 7,490,773 | B2 | * | 2/2009 | McVicker | .................... | 382/321 |
| 2006/0120751 | A1 | * | 6/2006 | McVicker | .................... | 399/107 |
| 2007/0077105 | A1 | * | 4/2007 | Sato et al. | .................... | 399/411 |

FOREIGN PATENT DOCUMENTS

| JP | 7-270142 | 10/1995 |
|---|---|---|
| JP | 09-307088 | 11/1997 |
| JP | 11-023236 | 1/1999 |
| JP | 2001-77977 | 3/2001 |
| JP | 2002-237923 | 8/2002 |
| JP | 2005-268471 | 9/2005 |

* cited by examiner

*Primary Examiner*—Kimberly A Williams
(74) *Attorney, Agent, or Firm*—McGinn IP Law Group, PLLC

(57) ABSTRACT

An electronic rubbed copy imaging system is provided and includes: a flat substrate; an imaging sheet; and a controlling portion that receives image data of the object read from the imaging sheet and applies a signal processing to the image data. The imaging sheet has: a plurality of light emitting elements that come close to an object and emit an illumination light to the object, and a plurality of light receiving elements that receives a reflected light of the illumination light from the object, and the light emitting elements and the light receiving elements are alternately aligned.

3 Claims, 7 Drawing Sheets

ELECTRONIC RUBBED COPY IMAGING SYSTEM

BACKGROUND OF THE INVENTION

1. Field of the Invention

The present invention relates to an electronic rubbed copy imaging system capable of capturing an image of an object faithfully at an equal magnification.

2. Description of Related Art

From ancient times, the rubbed copy used to make a faithful copy of surface unevenness of a stone monument, an earthenware, or the like is an important technique used in the investigation of the cultural assets, and the like. However, an object of investigation is defaced since an India ink, or the like must be applied onto the object of investigation.

Therefore, as set forth in JP-A-7-270142, the technology to recognize uneven profiles of the object of investigation by irradiating a laser beam onto the object of investigation and then store recognized results has been developed in the related art. Also, in the liquid crystal display with scanner set forth in JP-A-2001-77977, an image of the object is captured by the scanner and then the captured image is displayed on the liquid crystal display.

In the rubbed copy technique existing from ancient times, unless the unevenness exists on the object of investigation, such technique cannot make a faithful copy of the object of investigation. Also, in JP-A-7-270142, unless the unevenness exists, the pattern, etc. on the surface of the object of investigation cannot be recognized with good precision. In addition, even though curved shapes of the object of investigation are read by the scanner set forth in JP-A-2001-77977, it is difficult to record the shape of the object of investigation at an equal magnification.

SUMMARY OF THE INVENTION

An object of an illustrative, non-limiting embodiment of the present invention is to provide an electronic rubbed copy imaging system that makes it easy to record shapes, patterns, and the like of an object at an equal magnification with good precision.

According to one aspect of the invention, there is provided an electronic rubbed copy imaging system including a flat substrate; an imaging sheet having: and a controlling portion that receives image data of the object read from the imaging sheet and applies a signal processing to the image data. The imagines sheet has: a plurality of light emitting elements that come close to an object and emit an illumination light to the object; and a plurality of light receiving elements that receives a reflected light of the illumination light from the object, and the light emitting elements and the light receiving elements are alternately aligned.

In one aspect of the present invention, the light receiving element can have such a configuration that a first photoelectric converting layer for receiving red-color light to generate a photoelectron, a second photoelectric converting layer for receiving green-color light to generate a photoelectron, and a third photoelectric converting layer for receiving blue-color light to generate a photoelectron are stacked.

In one aspect of the present invention, the flat substrate may be a flexible sheet, and the imaging sheet can be curved to come close to the object.

In one aspect of the present invention, the flexible sheet may have a flexibility that allows the imaging sheet to come into tight contact with an outer periphery of the object.

In one aspect of the present invention, the imaging sheet may have at least one of a mark and a scale on the imaging surface. The mark indicates one of up, down, left, and right sides of the object, the scale indicates a size of the object, and an image of the object and the mark and/or the scale are captured.

BRIEF DESCRIPTION OF THE DRAWINGS

The features of the invention will appear more fully upon consideration of the exemplary embodiments of the inventions, which are schematically set forth in the drawings, in which.

DETAILED DESCRIPTION OF THE EXEMPLARY EMBODIMENTS

Although the invention will be described below with reference to the exemplary embodiments thereof, the following exemplary embodiments and modifications do not restrict the invention.

According to exemplary embodiments, it becomes easy to record the shape, the pattern, and the like of the object at an equal magnification with good precision.

An exemplary embodiment of the present invention will be explained with reference to the drawings hereinafter.

Figure 1A:
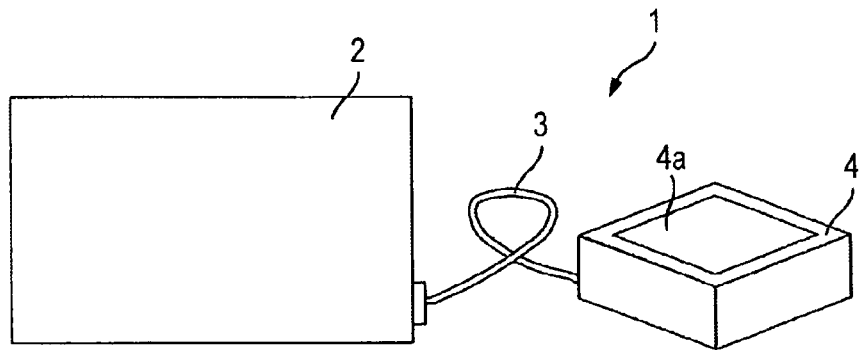
FIGS. 1A to 1D are explanatory views of an electronic rubbed copy imaging system according to an exemplary embodiment of the present invention.

FIG. 1A is an overall view of an electronic rubbed copy imaging system according to an embodiment of the present invention. An electronic rubbed copy imaging system 1 of the present embodiment includes an imaging sheet 2 having a flat plate shape, and a control unit 4 connected to the imaging sheet 2 via a cable 3.

A large number of light emitting elements and light receiving elements are formed and aligned alternately on the imaging surface (sensing surface) side of the imaging sheet 2, as described later. An image signal of the object obtained by capturing an image of the object by the imaging sheet 2 is fed into the control unit 4 via the cable 3, and the image is processed by the control unit 4. A signal processing circuit for processing the image, a memory, etc. are built in the control unit 4, and also a monitor device 4a is provided to the control unit 4.

Figure 1B:
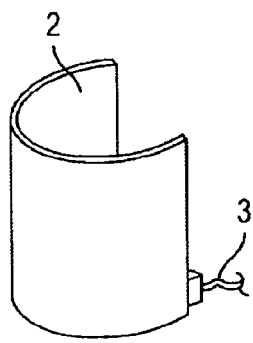
Figure 1C:
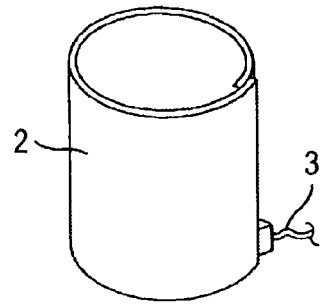
Figure 1D:
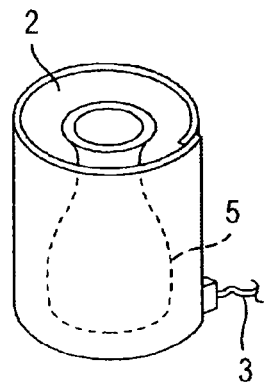

In this electronic rubbed copy imaging system 1, a flexible film made of the material such as PET (polyethylene terephthalate), or the like is employed as a substrate on which a large number of light emitting elements and light receiving elements are formed, and thus the imaging sheet 2 can be easily deformed into a semicircular cylinder or a circular cylinder, as shown in FIGS. 1B and 1C. Therefore, in the case that the patterns, etc. of an outer peripheral surface of the object of invention are to be recorded, the imaging sheet 2 is rolled up around an object 5 (a bottle in this illustrated example) of investigation to contact or come close to the object 5, as shown in FIG. 1D, and then the photograph is shot. As a result, the captured image of equal size to the object 5 of investigation can be obtained.

Figure 2:
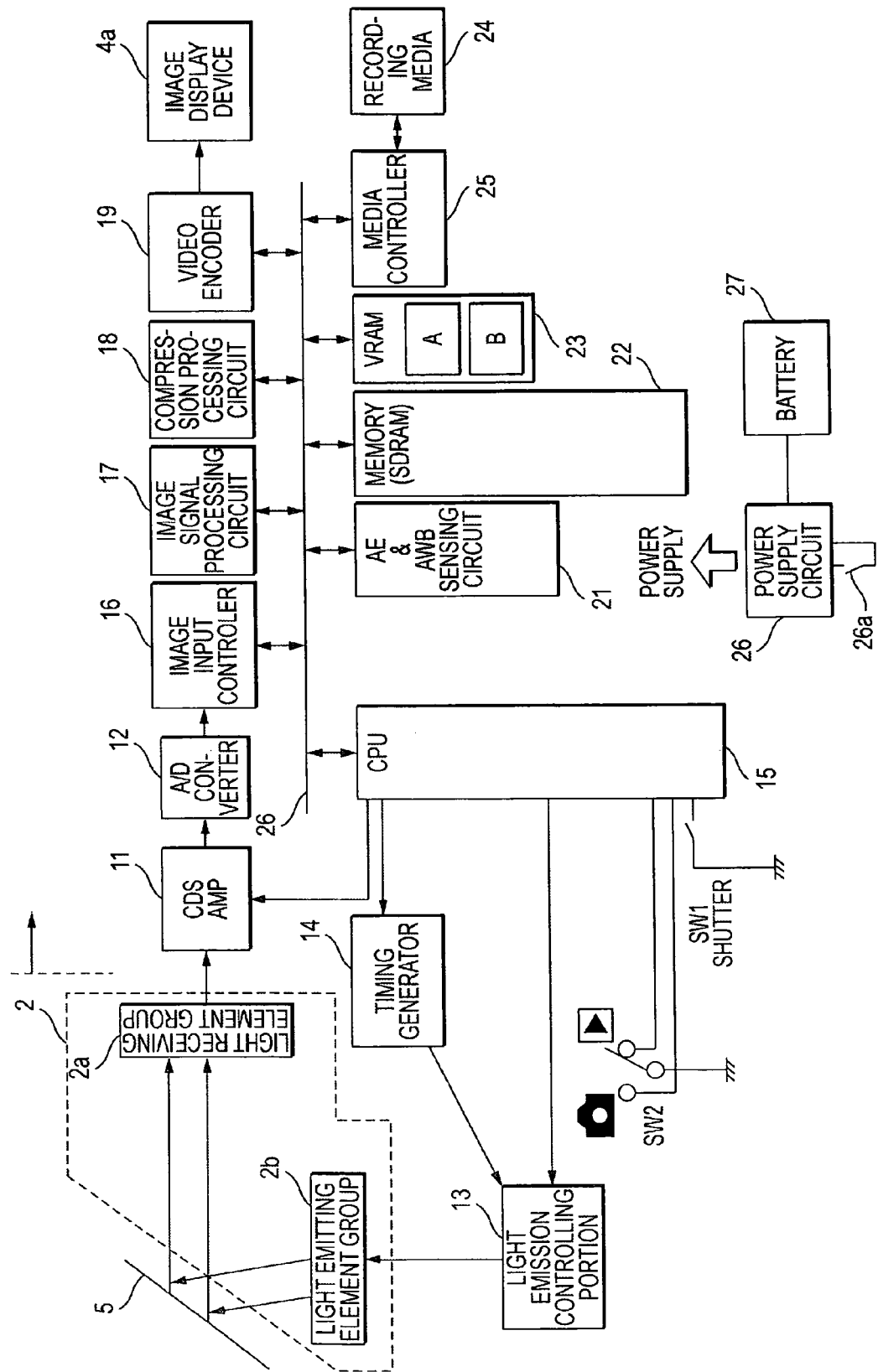
FIG. 2 is a block diagram of the electronic rubbed copy imaging system shown in FIG. 1A.

FIG. 2 is a functional block diagram of the electronic rubbed copy imaging system 1. The electronic rubbed copy imaging system 1 of the present embodiment includes the imaging sheet 2, a correlated double sampling circuit (CDS) 11 for processing an analog signal of image data output from the light receiving element group 2a of the imaging sheet 2, an A/D converter circuit 12 for converting the analog image signal output from the CDS 11 into a digital signal, a light emission controlling portion 13 for outputting a light emission control signal to the light emitting element group 2b of the imaging sheet 2, a timing generator 14 for outputting a drive timing signal to the light emission controlling portion 13 and the light receiving element group 2a, and a CPU 15 for controlling the overall electronic rubbed copy imaging system.

The electronic rubbed copy imaging system 1 of the present embodiment further includes an image input controller 16 for receiving image data output from the A/D converter circuit 12, an image signal processing circuit 17 for processing the image data, a compression processing circuit 18 for compressing the image data in JPEG format, or the like, a video encoder 19 for converting the image data into a video signal to display this data on the monitor device 4a, an AE (Automatic Exposure) & AWB (Automatic White Balance) sensing circuit 21, a memory (SDRAM) 22, a frame memory (VRAM) 23, and a media controller 25 for storing the image data in an external recording media 24. These constituent circuits and the CPU 15 are connected mutually via a bus 26.

Also, a power supply circuit 26 and a removable battery 27 are incorporated into the electronic rubbed copy imaging system 1. When a power supply switch 26a is turned ON, a power is supplied to respective constituent circuits of the electronic rubbed copy imaging system 1.

A two-stage release switch SW1, SW2 operated to respond to a shooting switch (shutter button) that is provided to the control unit 4 and not shown is connected to the CPU 15. When the user presses half the shooting switch to turn ON the switch SW1, the CPU 15 decides a quantity of light emitted from the light emitting element group 2b, an electronic shutter speed, and the like in response to the sensed result of the AE & AWB sensing circuit 21. Then, when the user presses fully the shooting switch to turn ON the switch SW2, a light emission from the light emitting element group 2b is controlled via the timing generator 14 and also the captured image data are read from the light receiving element group 2a.

This captured image data is fed to the VRAM 23 from the image input controller 16 through the CDS 11 and the A/D converter circuit 12. Also, the image signal processing circuit 17 applies various image processes to the image data, and also displays the captured image data on the monitor 4a and stores the image data compressed in JPEG format, or the like in the recording media 24.

FIGS. 3A to 3D are views showing an example of an alignment of the light receiving elements 2a and the light emitting elements 2b that are formed alternately on an imaging surface (sensing surface) of the imaging sheet 2.

Figure 3A:
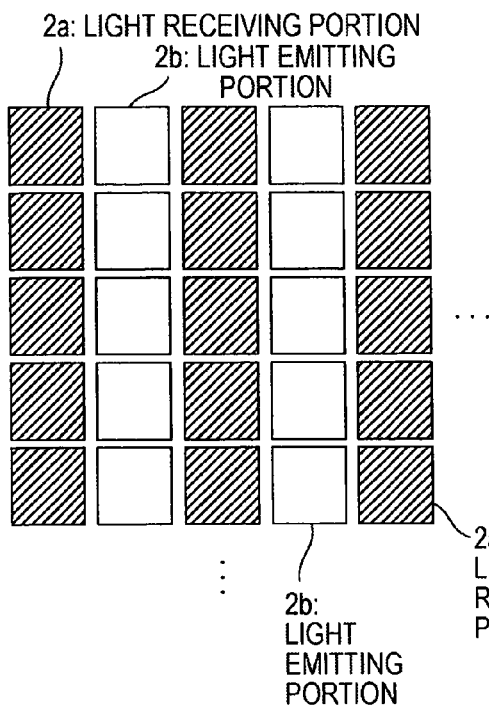
FIGS. 3A to 3D are schematic surface views of an imaging sheet in FIG. 1 showing an alignment of light emitting elements and light receiving elements.
Figure 3B:
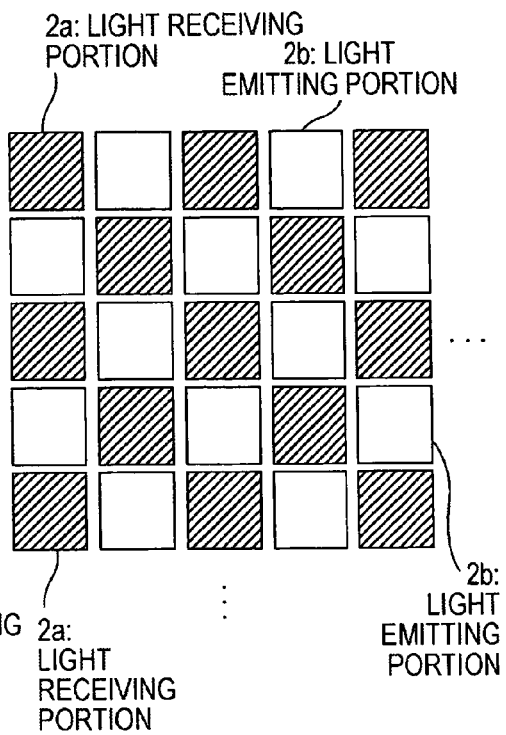
Figure 3C:
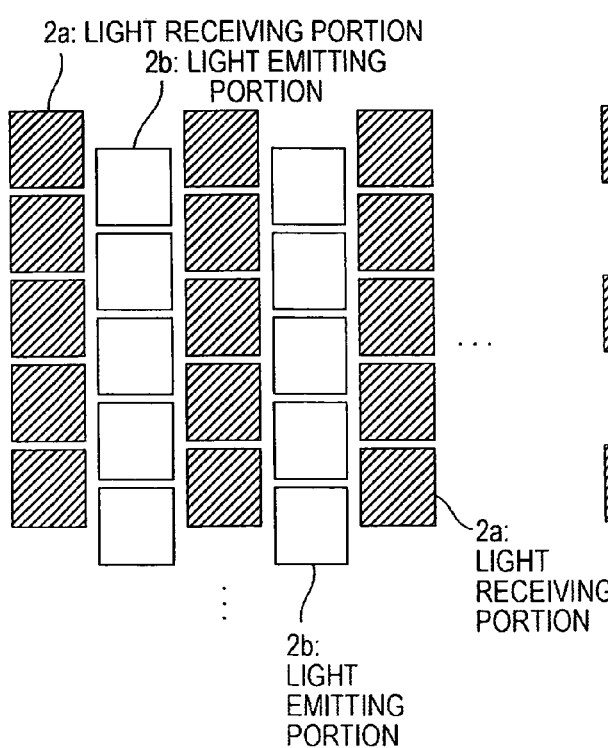
Figure 3D:
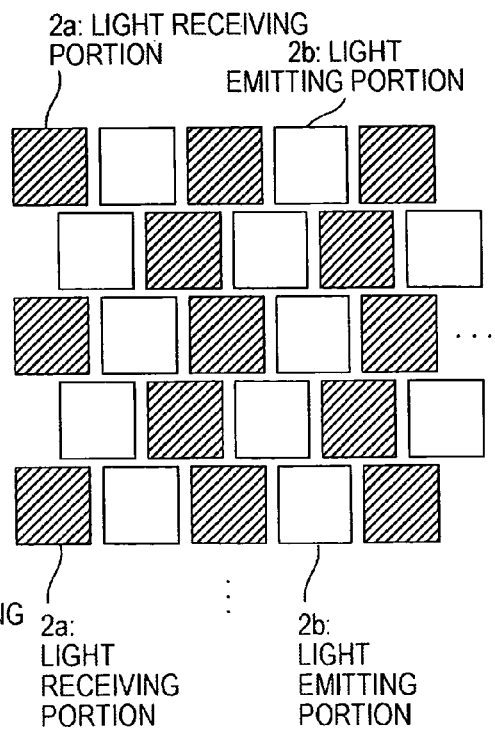

In FIG. 3A, the light receiving element columns 2a and the light emitting element columns 2b are formed alternately. In FIG. 3B, the light receiving element groups 2a and the light emitting element groups 2b are aligned like a checked pattern respectively. In FIG. 3C, the light receiving element columns 2a and the light emitting element columns 2b are formed alternately such that the light emitting element columns 2b are displaced from the light receiving element columns 2a by a ½ pitch. In FIG. 3D, the odd-numbered rows of the alignment in FIG. 3B are shifted from the even-numbered rows by a ½ pitch. The alignment of the light receiving elements 2a and the light emitting elements 2b is not restricted to the alignments shown in FIGS. 3A to 3D. Any alignment may be employed if the light receiving portions 2a and the light emitting portions 2b can be aligned alternately.

Figure 4:
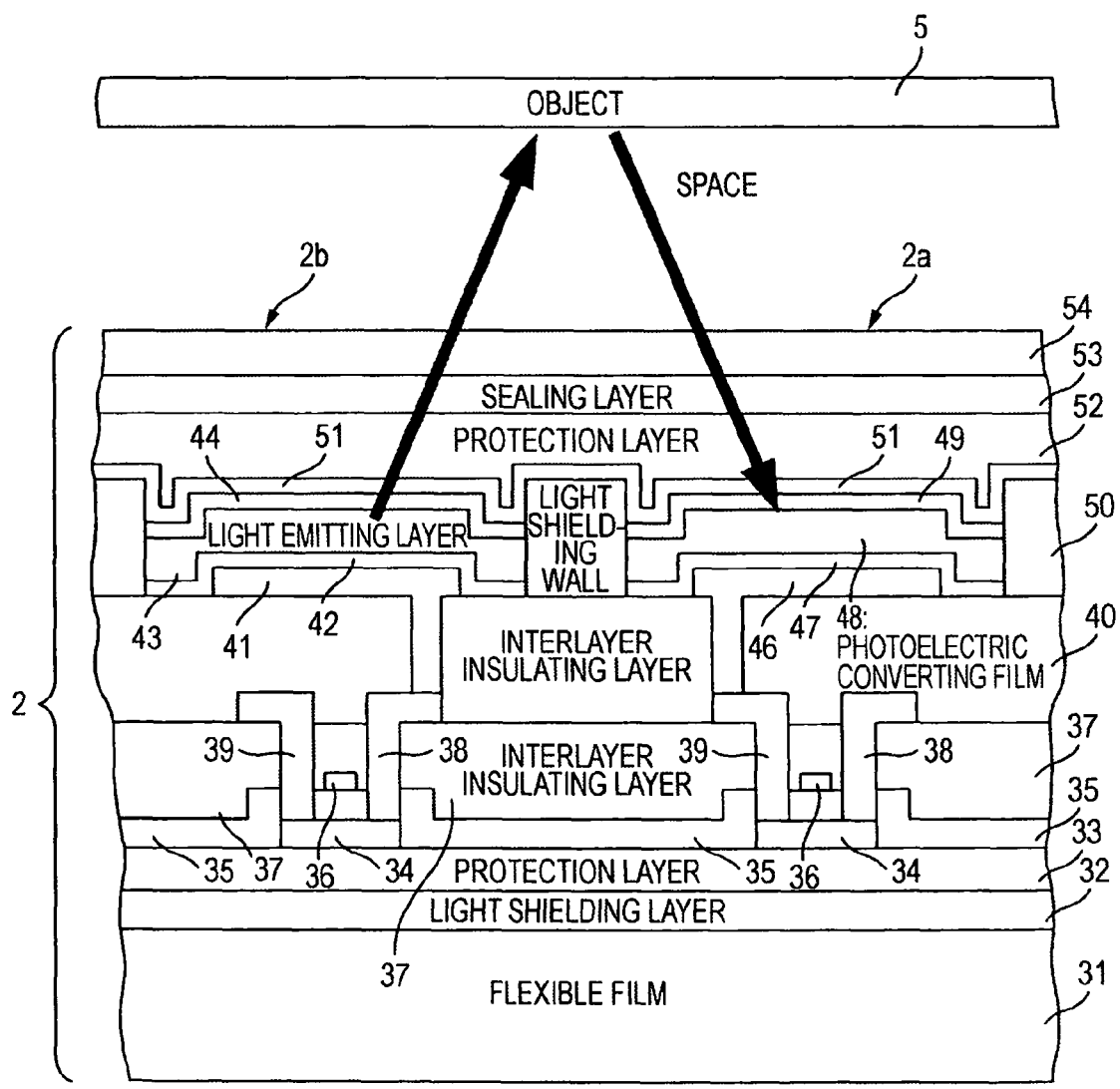
FIG. 4 is a schematic sectional view neighboring light receiving element and light emitting element of the imaging sheet (monochrome image shooting) according to an exemplary embodiment of the present invention.

FIG. 4 is a schematic sectional view of the imaging sheet 2 and a schematic sectional view of neighboring light emitting element and light receiving element shown in FIGS. 3A to 3D. The imaging sheet 2 explained in FIG. 4 is used to shoot the monochrome image. This imaging sheet 2 is manufactured by utilizing the technology to manufacture the TFT matrix on the liquid crystal substrate, the technology to manufacture the organic EL device, or the like. A light shielding layer 32 and a protection layer 33 are formed on a flexible film 31 as a base body. Then, a semiconductor layer 34 is formed on the protection layer 33 in light receiving element forming areas and light emitting element forming areas. Then, an overall surface of a resultant structure is covered with a gate insulating film 35.

A gate electrode film 36 is formed on the gate insulating film 35 in locations corresponding to the semiconductor layers 34, and then an overall surface of a resultant structure is covered with an interlayer insulating layer 37. Then, contact holes are opened in the interlayer insulating layer 37 and the gate insulating film 35 to reach sources and drains of the semiconductor layers 34 respectively. Then, source electrodes 38 and drain electrodes 39 are formed in the contact holes, and then an interlayer insulating layer 40 is formed on the interlayer insulating layer 37.

In the light emitting element 2b, a pixel electrode film 41 connected to the source electrode 38, which is formed just under this film 41, is formed on the interlayer insulating layer 40. Then, an electron transporting layer 42 is formed thereon, a light emitting layer 43 is formed thereon, and a hole transporting layer 44 is formed thereon.

In the light receiving element 2a, a pixel electrode film 46 connected to the drain electrode 39, which is formed just under this film 46, is formed on the interlayer insulating layer 40. Then, a hole blocking layer 47 is formed thereon, a photoelectric converting film 48 for generating photoelectrons in response to a quantity of received light is formed thereon, and an electron blocking layer 49 is formed thereon.

Then, a light shielding wall 50 is provided between the light emitting portion 2b and the neighboring element, i.e., the light receiving element 2a in this illustrated example. An opposing electrode film (common electrode film) 51 is formed on overall surfaces of the light shielding walls 50, the hole transporting layers 44, and the electron blocking layers 49.

Then, a transparent protection layer 52 is formed on the common electrode film 51. Then, a transparent coating layer 53 is formed thereon, and a transparent sealing layer 54 is formed thereon.

Figure 5:
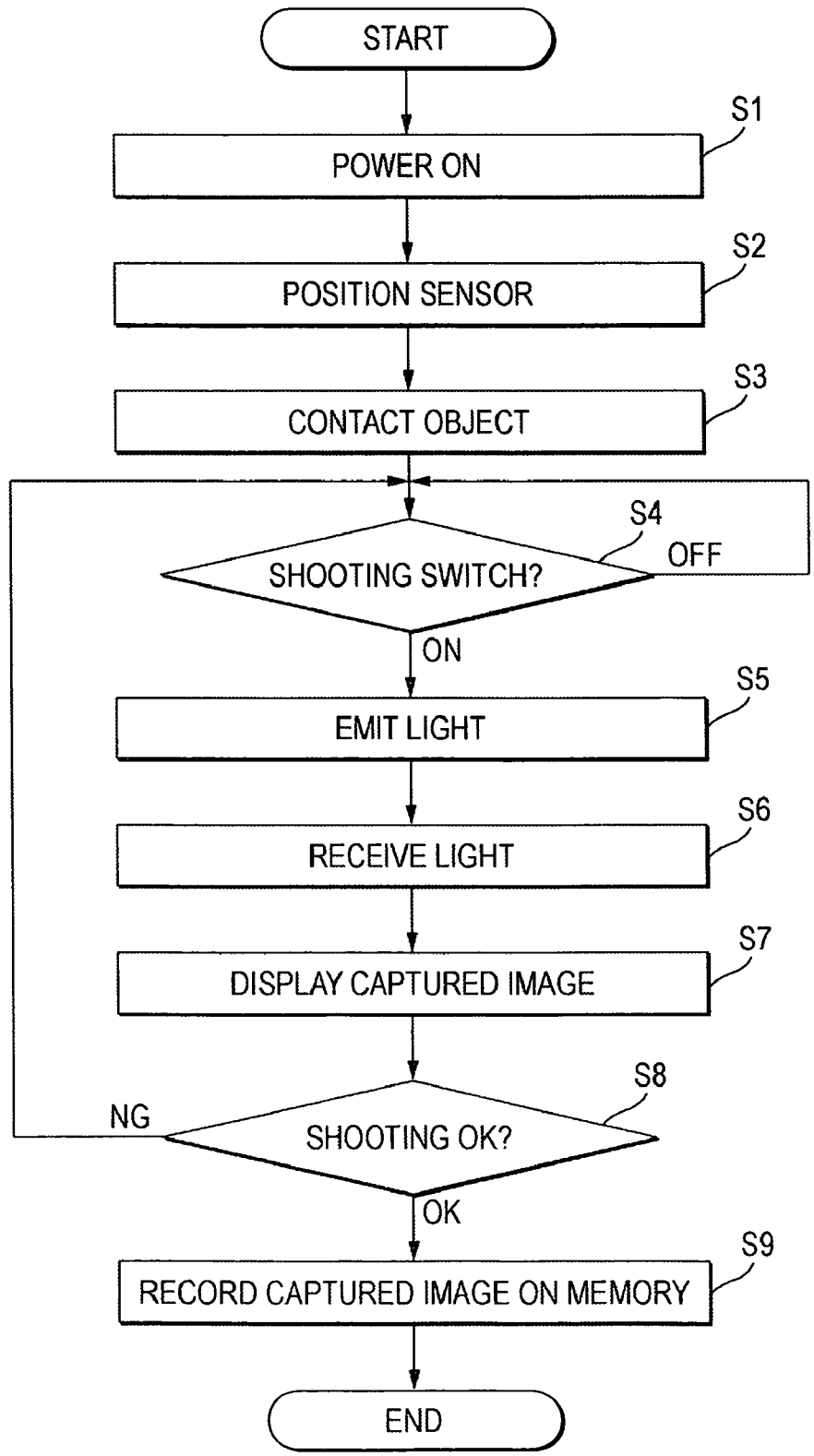
FIG. 5 is a flowchart showing shooting procedures using the electronic rubbed copy imaging system according to an exemplary embodiment of the present invention.

FIG. 5 is a flowchart showing procedures of shooting the object 5 using the electronic rubbed copy imaging system constructed as above. When the power supply switch 26a shown in FIG. 2 is turned ON (step S1), the electronic rubbed copy imaging system 1 is set to its available condition. Then, the user positions the imaging sheet (sensor) 2 (step S2). In the example shown in FIG. 1D, the imaging sheet 2 is rolled up to surround the object 5 while directing the sensing surface inward.

Then, the user brings the imaging sheet 2 into tight contact with the object (step S3). Then, the CPU 15 waits for the pressing of the shooting switch (SW1, SW2) (step S4).

When the CPU 15 senses the turning-ON of the release switch SW2 after the user presses the shooting switch, such CPU outputs the light emission instruction to the light emission controlling portion 13 via the timing generator 14. This light emission instruction is applied to the gate electrode film 36 of the light emitting portion 2b shown in FIG. 4, and an electric conduction between the drain electrode 39 and the source electrode 38 is obtained. Accordingly, a predetermined voltage is applied between the pixel electrode film 41 (drain electrode 39) and the common electrode film 51, and thus the light emitting layer 43 emits light to illuminate the object 5 (step S5).

Then, when reflected light from the object 5 is incident on the photoelectric converting layer 48, this photoelectric converting layer 48 generates the photoelectrons in response to a quantity of received light. The photoelectrons flow into the pixel electrode film 46 and then flow into the drain electrode 39 formed just under the light receiving element 2a (step S6).

Then, when the CPU 15 issues the output command to the timing generator 14, this output command is applied to the gate electrode film 36 just under the light receiving element 2a. Then, the photoelectrons flow from the drain electrode 39 to the source electrode 38 via the semiconductor layer 34, and then are output from the imaging sheet 2 as the image data.

The image data output from the imaging sheet 2 is fetched by the control unit 4, and is objected to the signal processing and displayed on the monitor 4a (step S7). When the user checks the video on the monitor 4a and decides that the shooting is OK (step S8), this user informs the CPU 15 of that effect via an operation switch (not shown). Accordingly, the captured image data is recorded on the media 24 (step S9).

When the user decides that the shooting is NG (step S8), this user informs the CPU 15 of that effect via the operation switch (not shown). Accordingly, the image data captured at this time is disposed. Then, the process goes back to step S4 and the CPU 15 waits for the turning-ON of the release switch.

In the present embodiment, the user decides on the spot every single time whether or not the captured image data is good, and then the image data is recorded on the recording media 24. In this case, like the ordinary digital camera, the captured image data may be recorded unconditionally on the recording media 24 once and then the user may delete the image data that are decided as NG.

As described above, according to the electronic rubbed copy imaging system of the present embodiment, the faithful image of the same size as the object can be captured and thus the image data as the rubbed copy can be easily collected.

Here, the imaging sheet shown in FIG. 4 is used for the monochrome image shooting, but an imaging sheet used for the color image shooting can be realized. In the example shown in FIG. 4, a single layer of the photoelectric converting layer 48 is provided. In this case, three sets of layer configurations each consisting of the photoelectric converting layer 48 and the blocking layers 47, 49, the pixel electrode film 46 and the common electrode film 51, which are provided under and on the photoelectric converting layer 48 respectively, may be laminated via a transparent insulating layer. The photoelectric converting layers 48 in respective sets may be used as the photoelectric converting layer for sensing red-color light, the photoelectric converting layer for sensing green-color light, and the photoelectric converting layer for sensing blue-color light respectively. Also, the pixel electrode film and the common electrode film are formed of the transparent electrode film.

In addition, the transistor for red color, the transistor for green color, and the transistor for blue color may be provided as the transistors (34, 35, 36, 38, 39) provided just under the light receiving element 2a in FIG. 4, and also a light emitting element for emitting white light in which a red color, a green color, and a blue color are mixed may be provided as the light emitting element 2b. Therefore, the color image of the object can be captured.

Also, in the present embodiment, PET is used as the flexible film 31 serving as the base body of the imaging sheet 2. Also, a sheet having a higher flexible performance can be employed. For example, if the light emitting elements and the light receiving elements are formed on a highly flexible sheet such as a handkerchief, or the like as in the above embodiment, the image similar to that obtained when a fish rubbing is made on a Japanese paper can be captured as the electronic data. In addition, if the imaging sheet that is available for the color image shooting is employed, the image data that is faithful to not only the shape and the pattern of the object but also the color of the object can be obtained.

Figure 6:
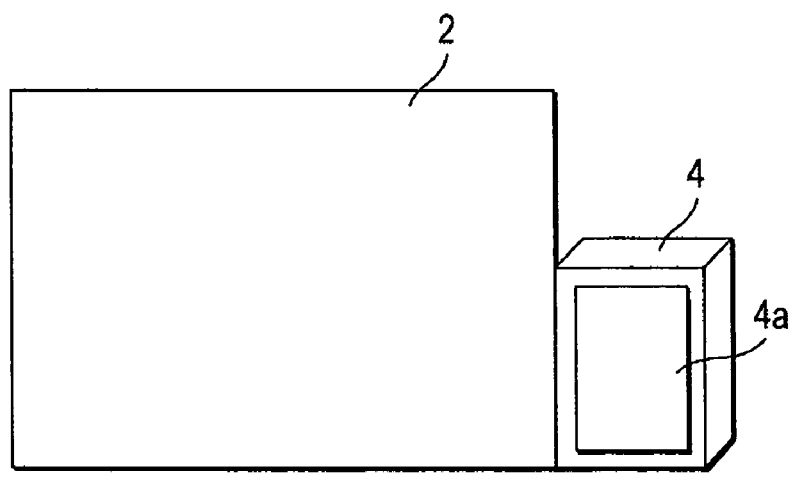
FIG. 6 is a view showing an electronic rubbed copy imaging system according to another exemplary embodiment of the present invention.

FIG. 6 is a configurative view showing another embodiment of an electronic rubbed copy imaging system. In the embodiment shown in FIG. 1A, the imaging sheet 2 and the control unit 4 are connected by the cable 3. In the embodiment shown in FIG. 6, the control unit 4 is provided integrally with the imaging sheet 2 in the peripheral area.

Figure 7:
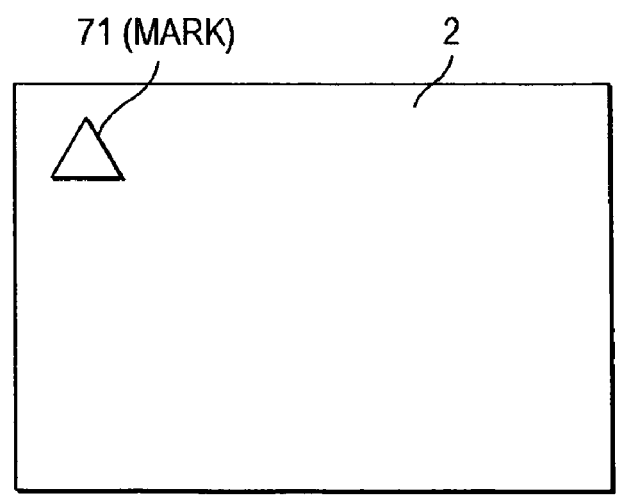
FIG. 7 is an explanatory view of an imaging sheet in an electronic rubbed copy imaging system according to another exemplary embodiment of the present invention.

FIG. 7 is a view showing still another embodiment of the imaging sheet 2. When the user captures the image of the object by using the imaging sheet 2, sometimes he or she cannot decide the upper and lower sides of the object from the captured image data. Therefore, in the present embodiment, a mark 71 indicating an "up" side of the object is provided to a sensing surface (imaging surface), and then the image of the object as well as the mark 71 is captured.

Figure 8A:
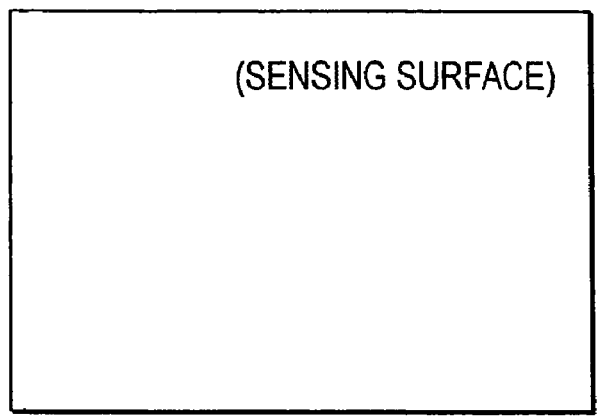
FIGS. 8A and 8B are explanatory views of an imaging sheet in an electronic rubbed copy imaging system according to another exemplary embodiment of the present invention.
Figure 8B:
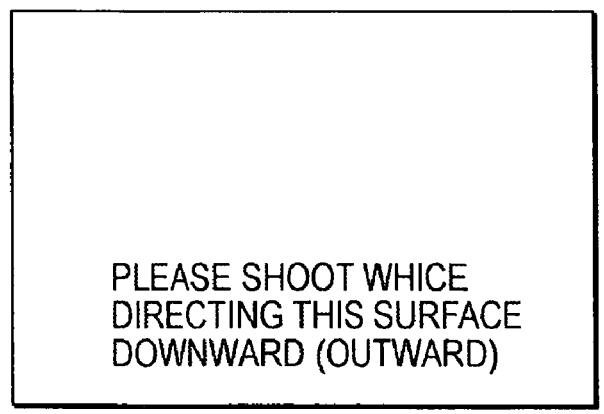

FIGS. 8A and 8B are views showing yet still another embodiment of the imaging sheet 2. In some cases the user did the wasteful shooting unless he or she can easily discriminate the front and back surfaces (the sensing surface and the back surface) of the imaging sheet 2. Therefore, in the present embodiment, no mark is provided on the sensing surface (FIG. 8A) and a passage of explanation is printed on the back surface (FIG. 8B) of the imaging sheet, so that the user can decide easily the front and back surfaces of the imaging sheet.

Figure 9:
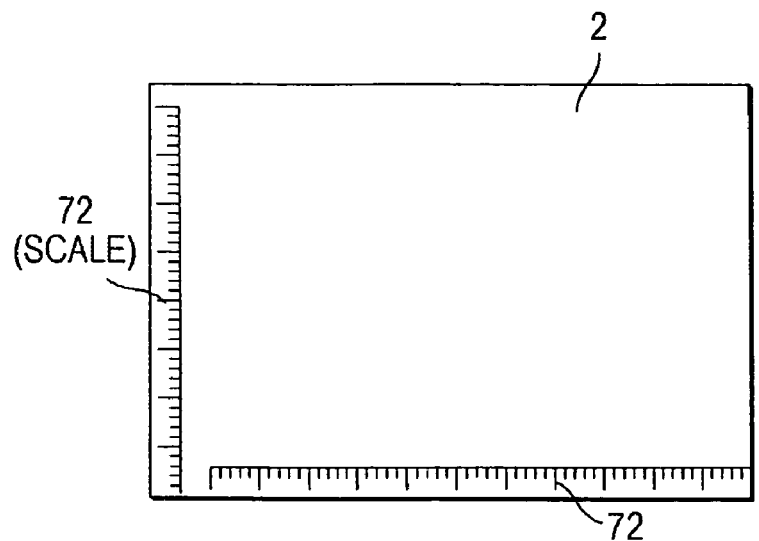
FIG. 9 is an explanatory view of an imaging sheet in an electronic rubbed copy imaging system according to another exemplary embodiment of the present invention.

FIG. 9 is a view showing further embodiment of the imaging sheet 2. In the case where the user captures the image of the object by using the imaging sheet 2, when the number of pixels provided to the imaging sheet 2 is increased larger, the image of the object is displayed correspondingly larger on the monitor screen. Thus, the user cannot understand a size of the object. Therefore, in the present embodiment, a scale 72 is printed on the sensing surface of the imaging sheet 2, and then the user captures the image of the object together with the scale 72. Accordingly, the user can decide easily a size of the object by merely looking at the image. Besides, an embodiment can be created by combining the embodiments in FIG. 7, FIGS. 8A and 8B, and FIG. 9 together.

The electronic rubbed copy imaging system according to the present invention can shoot a photograph of the object faithfully. Therefore, the electronic rubbed copy imaging system of the present invention can leave the data being faithful to the object as electronic data like the traditional rubbed copy, and is useful to the digital camera used in the academic investigation, and the like.

While the invention has been described with reference to the exemplary embodiments, the technical scope of the invention is not restricted to the description of the exemplary embodiments. It is apparent to the skilled in the art that various changes or improvements can be made. It is apparent from the description of claims that the changed or improved configurations can also be included in the technical scope of the invention.

This application claims foreign priority from Japanese Patent Application No. 2005-288454, filed Sep. 30, 2005, the entire disclosure of which is herein incorporated by reference.

What is claimed is:

1. An electronic rubbed copy imaging system, comprising:
   a flat substrate;
   an imaging sheet having: a plurality of light emitting elements that come close to an object and emit an illumination light to the object, and a plurality of light receiving elements that receives a reflected light of the illumination light from the object, wherein the light emitting elements and the light receiving elements are alternately aligned; and
   a controlling portion that receives image data of the object read from the imaging sheet and applies a signal processing to the image data,
   wherein the flat substrate is a flexible sheet, which causes the imaging sheet to be curved to come close to the object.

2. The electronic rubbed copy imaging system according to claim 1, wherein each of the light receiving elements comprises: a first photoelectric converting layer that receives red-color light to generate a photoelectron; a second photoelectric converting layer that receives green-color light to generate a photoelectron; and a third photoelectric converting layer that receives blue-color light to generate a photoelectron, the first, second and third photoelectric converting layer being stacked.

3. The electronic rubbed copy imaging system according to claim 1, wherein the flexible sheet has a flexibility that allows the imaging sheet to come into tight contact with an outer periphery of the object.

* * * * *